(12) United States Patent
Rostalski et al.

(10) Patent No.: US 8,451,458 B2
(45) Date of Patent: *May 28, 2013

(54) IMAGING MICROOPTICS FOR MEASURING THE POSITION OF AN AERIAL IMAGE

(75) Inventors: Hans-Juergen Rostalski, Oberkochen (DE); Heiko Feldmann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/423,760

(22) Filed: Mar. 19, 2012

(65) Prior Publication Data

US 2012/0176670 A1   Jul. 12, 2012

Related U.S. Application Data

(63) Continuation of application No. 12/722,706, filed on Mar. 12, 2010, now Pat. No. 8,164,759, which is a continuation of application No. PCT/EP2008/007568, filed on Sep. 12, 2008.

(30) Foreign Application Priority Data

Sep. 14, 2007   (DE) .......................... 10 2007 043 896

(51) Int. Cl.
*G02B 13/14* (2006.01)

(52) U.S. Cl.
USPC ........................................ 356/614; 356/620

(58) Field of Classification Search
USPC ............................................... 356/614, 620
See application file for complete search history.

(56) References Cited

U.S. PATENT DOCUMENTS

| | | | |
|---|---|---|---|
| 5,808,805 | A | 9/1998 | Takahashi |
| 5,914,774 | A | 6/1999 | Ota |
| 5,930,049 | A | 7/1999 | Suenaga et al. |
| 6,406,820 | B1 | 6/2002 | Ota |
| 6,906,305 | B2 | 6/2005 | Pease et al. |
| 6,956,694 | B2 | 10/2005 | Shafer et al. |
| 7,050,223 | B1 | 5/2006 | Hoppen |
| 7,215,408 | B2 | 5/2007 | Hamatani et al. |
| 7,672,044 | B2 | 3/2010 | Enkisch et al. |
| 2002/0041377 | A1 | 4/2002 | Hagiwara et al. |
| 2004/0070846 | A1 | 4/2004 | Dobschal et al. |
| 2004/0174607 | A1 | 9/2004 | Brunner et al. |
| 2006/0256447 | A1 | 11/2006 | Dodoc |
| 2006/0262306 | A1 | 11/2006 | Dobschal et al. |
| 2007/0076181 | A1 | 4/2007 | Ishii et al. |
| 2007/0076182 | A1 | 4/2007 | Hazelton et al. |

FOREIGN PATENT DOCUMENTS

| | | |
|---|---|---|
| EP | 1 791 164 | 5/2007 |
| JP | 11-326772 | 11/1999 |
| WO | WO 2006/105122 | 10/2006 |

OTHER PUBLICATIONS

The International Search Report and a Written Opinion from the counterpart PCT Application No. PCT/EP2008/007568, filed Sep. 12, 2008.

*Primary Examiner* — Layla Lauchman
(74) *Attorney, Agent, or Firm* — Fish & Richardson P.C.

(57) ABSTRACT

An imaging microoptics, which is compact and robust, includes at least one aspherical member and has a folded beam path. The imaging microoptics provides a magnification $|\beta'|$ of >800 by magnitude. Furthermore, a system for positioning a wafer with respect to a projection optics includes the imaging microoptics, an image sensor positionable in the image plane of the imaging microoptics, for measuring a position of an aerial image of the projection optics, and a wafer stage with an actuator and a controller for positioning the wafer in dependence of an output signal of the image sensor.

21 Claims, 11 Drawing Sheets

IMAGING MICROOPTICS FOR MEASURING THE POSITION OF AN AERIAL IMAGE

CROSS-REFERENCE TO RELATED APPLICATIONS

This application is a continuation of, and claims benefit under 35 USC 120 to, U.S. application Ser. No. 12/722,706, filed Mar. 12, 2010, which is a continuation of, and claims benefit under 35 USC 120 to, international application PCT/EP2008/007568, filed Sep. 12, 2008, which claims benefit of German Application No. 10 2007 043 896.8, filed Sep. 14, 2007. U.S. application Ser. No. 12/722,706 and international application PCT/EP2008/007568 are hereby incorporated by reference in their entirety.

FIELD

The disclosure relates to an imaging microoptics for measuring the lateral position of an aerial image, in particular of a wafer illumination device. Further, the disclosure relates to a system comprising an imaging microoptics, an image sensor and a positioning device, in particular for the wafer.

BACKGROUND

It is known from patent application US 2007/0076182 A1 to provide an aerial image sensor in a laterally movable wafer stage. This terminology will be maintained also in conjunction with high aperture immersion lithography, although the image in this case is not generated in air, but in the immersion medium. It is also known, for example, from patent application US 2002/0041377 A1, to position such an aerial image sensor beside the actual wafer support. This known sensor operates in a slit-scan mode, and thus does not provide a simultaneous complete imaging.

SUMMARY

The disclosure provides an imaging optics and a system, which avoids certain drawbacks associated with previously known imaging optics and systems.

Embodiments of the disclosure according to a first aspect provide an imaging microoptics with an overall positive power optical lens group and a spaced-apart overall negative optical lens group, wherein the imaging microoptics has a total magnification of magnitude above 800, and a longitudinal extension of less than 250 mm. Such an extremely magnifying, and at the same time exceptionally compact optics may be entirely integrated in a wafer stage, without the accelerations of up to 10 g hampering its performance. In particular, it may constitute a projection optics, a UV optics and/or a high aperture optics with a numerical aperture of larger than 0.9. In embodiments, the numerical aperture is at least 1.2, at least 1.3, or at least 1.35. In an embodiment, the length of the imaging microoptics in the longitudinal direction of the microlithography projection objective lens is 140 mm or less, or 100 mm or less. In an embodiment, its resolution is better than $0.5\ \text{nm}^{-1}$ or $1.0\ \text{nm}^{-1}$, meaning that features separated by 2 nm resp. 1 nm may be distinguished.

Under a second aspect, embodiments of the disclosure provide a system including such an imaging microoptics, an image sensor and a positioning device, with which the position of the wafer relative to a mask image projected by a projection optics may be accurately adjusted. The imaging microoptics may be arranged at the wafer stage, but may also be arranged at a metro stage or at a metro frame, i.e. the mounting of the projection optics.

Exemplary DUV immersion microscope objective lenses have a numerical aperture NA>0.9, in particular 1.2 to 1.4, such as 1.3 to 1.35 or larger and have at least 4, at most 7 lenses, including a first lens assembly with overall positive refractive power, the total length of which is less than 20 mm, and a second lens assembly of overall negative refractive power, wherein a space free of (refractive) elements between the first lens assembly and the second lens assembly along the optical axis is less than 10 mm, in particular less than one half the total length of the first lens assembly. At least the first and the last lens of altogether three to five lenses of the first lens assembly have positive refractive power; at least the last element of the second lens assembly has itself a negative refractive power and in particular is a meniscus lens, that surface of which facing the first lens assembly is made concave.

In an embodiment, the total length of the second lens assembly is less than 30 mm, in particular less than three halves the total length of the first lens assembly. In another embodiment, the total length of the second lens assembly is less than 15 mm, in particular less than three quarters the total length of the first lens assembly.

In order to achieve the low number of lenses, while maintaining a sufficient aberration correction, in a variant two of the surfaces of the first lens assembly are formed as aspherical surfaces, e.g. deformed spherical surfaces, and/or as diffractive optical surfaces. It is also possible, for one or more, in a variant for all the lenses of the first lens assembly or even for all the lenses of the first optical lens group, to use a particularly highly refractive material, in particular a material with a refractive index at 193 nm of >1.8 or even >1.9, e.g. spinel ($n_{193}$=1.92).

By this measure, it may be achieved that the total length of the objective lens, including the total lengths of the first and second lens assembly, respectively, and the space in between free of active elements, is less than 40 mm.

In front of the front lens, in some applications a planoparallel plate, e.g. made of quartz, is arranged, which itself may be spaced apart from the front lens by a water film. This helps maintaining in operation an exactly constant positioning of the front lens.

Between the first optical lens group, namely the actual objective lens, and the second optical lens group, in some embodiments at least one element deflecting the beam path in a folding plane may be positioned, in particular one or more plane mirrors, which in embodiments may be formed as inner surfaces of prisms. Herein, pentaprisms are suitable, because same are little liable to misadjustment. Further mirror surfaces, again e.g. in pentaprisms, may be located downstream of the second optical lens group, for reducing the overall dimensions of the optics. In some applications, the beam path may be folded with a mirror staircase ("Spiegeltreppe"), so that it crosses itself in the region of the objective lens or downstream thereof. In other applications, the beam path may be multiply folded in planes perpendicular to one another.

From the small dimensions and distances of the various optical components from one another, a small moment of inertia results relative to the intersection of the optical axis of the UV microprojection optics with the plane of the aerial image, from which small moment of inertia favourable mechanical properties result.

In embodiments, an imaging ratio (magnification) is more than 1000 (by magnitude), e.g. β' may be −1200 to −1500. Herein, the field size is 2 μm to 22 μm, the image size is 3 mm to 30 mm. In embodiments, the optics according to the disclosure are non-cemented, because on the one hand, relatively narrow-banded light sources are used and therefore chromatic aberration is not a prime issue, and on the other hand, the DUV-ressistivity might be compromised by the cement. The beam diameter is maximally 17-20 mm in the region of the first lens assembly of the objective lens, and is below 1 mm in the region of the second optical lens group. For correcting deficiencies stemming from the manufacture or the adjustment in particular of the small lenses of the latter, in some applications one or several ($\leqq 5$) correction elements with small free diameters and small correction amounts may be employed. Also, manipulatable, namely elements displaceable and/or variable with respect to their refractive power, may be employed for further correcting in particular the spherical aberration. Furthermore, the small lenses of the second optical lens group may be formed planoconcave or biconcave, and may be embedded in plane plates of larger diameter. These lenses may, for stable mounting, be attached to the prisms, if present. The objective lenses may be supported by quartz mounts, where they are fixed by bonding.

The actual objective lens including the first and the second lens assemblies may form a convergent beam bundle having a reciprocal image distance of more than $10\ m^{-1}$, or more than $20\ m^{-1}$ (as measured from the last element of the second lens assembly), which is directed to the image plane upon beam bundle widening by the second optical lens group. Alternatively, the objective lens may provide an imaging essentially to infinity, to provide modularity; in particular, it may provide a reciprocal image distance of less than $1\ m^{-1}$ by magnitude, or less than $0.2\ m^{-1}$ by magnitude. In this case, a further focussing lens or lens group is arranged between the first and the second optical lens groups as a tubus lens, and the second optical lens group includes one or two additional defocussing lenses; in an embodiment the length of such lenses exceeds their diameter.

BRIEF DESCRIPTION OF THE DRAWINGS

The foregoing as well as other advantageous features of the disclosure will be more apparent from the following detailed description of exemplary embodiments of the disclosure with reference to the accompanying drawings. It is noted that not all possible embodiments of the disclosure necessarily exhibit each and every, or any, of the advantages identified herein.

DETAILED DESCRIPTION OF EXEMPLARY EMBODIMENTS

Figure 1:
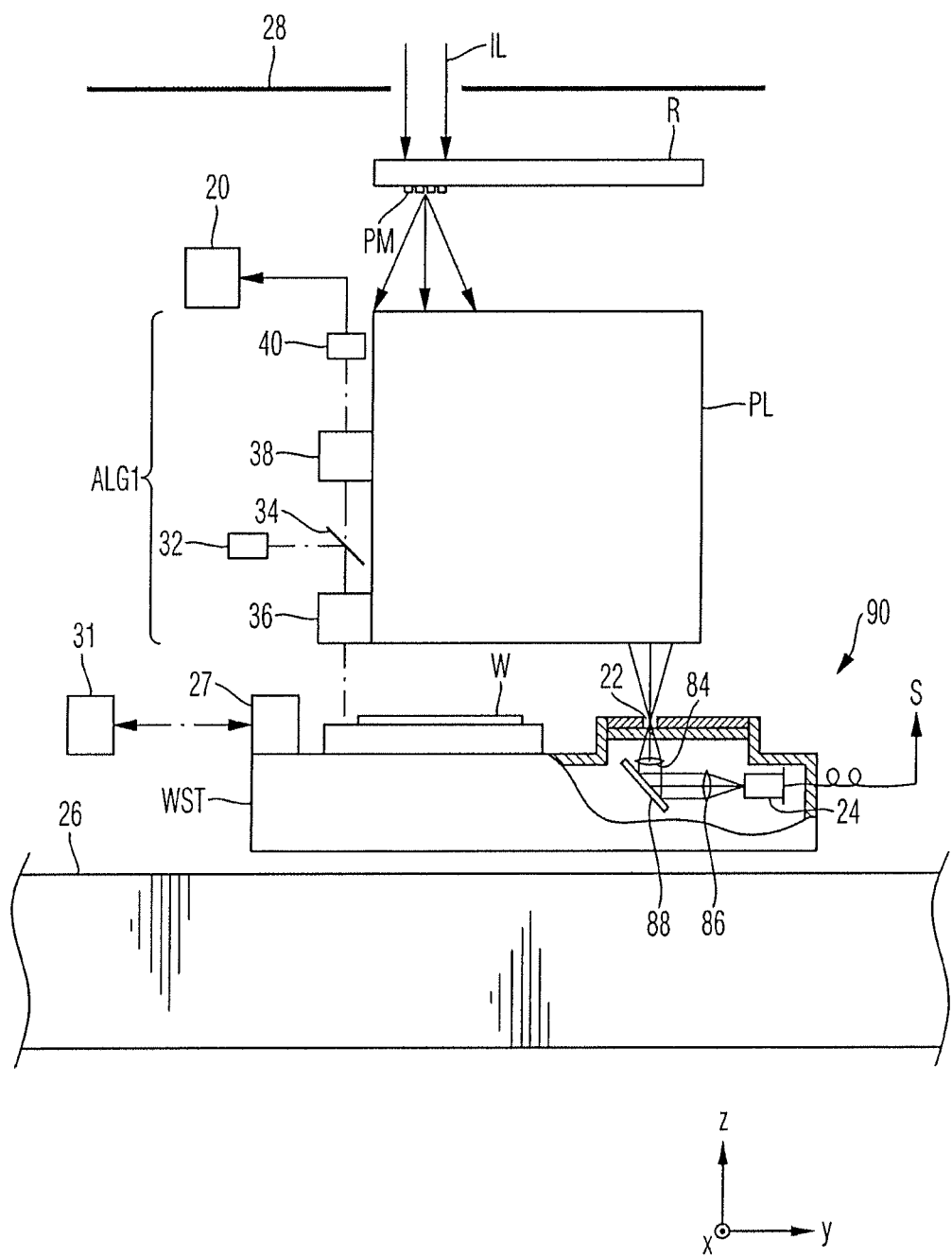
FIG. 1 a known wafer stage with an aerial image sensor.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 shows a known system with a mask (or reticle) R, a projection optics PL, a wafer stage WST and a slit-scan-sensor 90. The illuminating light IL is directed through the aperture 28 onto the mask having a mark PM, transits the projection optics PL and impinges, through a slit 22 and a folded optics 84, 86, 88, onto a detector 24. The output signal of same is supplied to a controller S. The lateral x,y-position of the wafer stage WST is detected by a distance measuring unit 27, 31. The orientation and the distance z of the projection optics to the wafer is detected by a corresponding arrangement 32, 34, 36, 38, 40 and supplied to a controller 20. Mask R, projection optics PL and wafer stage WST are positionally controllable with respect to a base 26. Not shown are a metro stage for supporting the projection optics PL and a mask support. The illumination of the wafer W may be conducted discontinually in a step-mode, or continually in a scan-mode.

Figure 2:
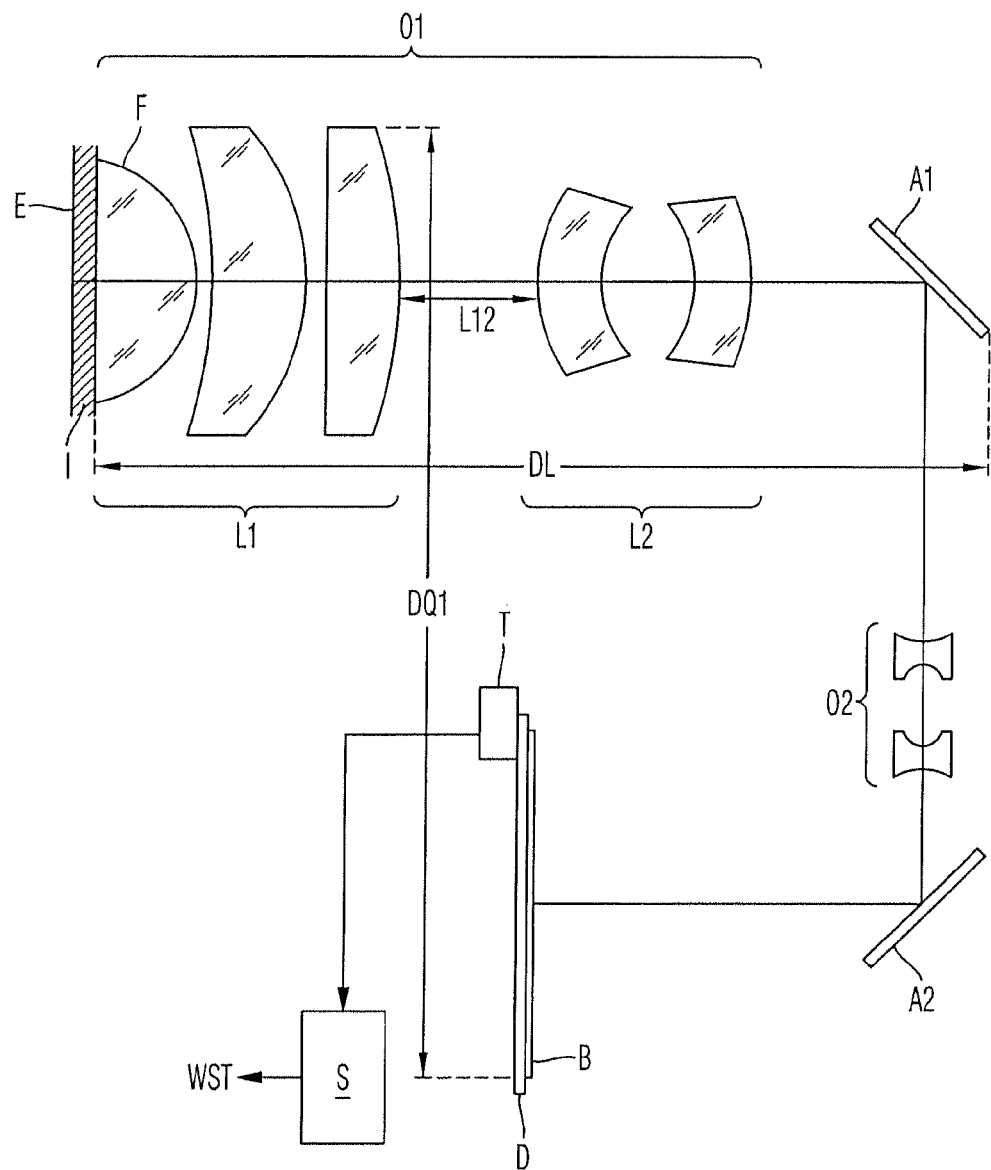
FIG. 2 a principal set up of a microprojection optics.

In FIG. 2, the arrangement of a microprojection optics is shown in principle, not exactly to scale, but scaled on the order of 2:1. The optical lens group O1 next to the plane E of the aerial image constitutes the objective lens, which itself may be partitioned into a positive lens group L1 and a negative lens group L2. A beam path follows, which in this example is twice folded by 90° each by two mirrors A1, A2, and which includes a second optical lens group O2 directing the beam bundle upon slight defocusing onto the light sensitive layer B of a detector D. The output signal of the detector D is supplied by the transmitting unit T to an evaluation unit S. The evaluation unit S can be coupled to a positioning device (not shown) for the wafer stage WST, the mask support or the metro stage for positioning the projection optics. Between the plane E of the aerial image and the front lens F of the first lens assembly L1, it is indicated by hatching that in operation there will be water I present an immersion medium. The space beyond the plane E of the aerial image up to the front lens of the projection optics also filled with water in operation is not shown. The longitudinal extension of the optics from the front lens F on is indicated as DL, the cross extension perpendicular thereto and in the folding plane is indicated as DQ1. In this regard, the optics includes the lenses and, if present, mirrors and prisms as well as the light sensitive layer B of the detector, but not any peripheral or backward parts of same, and the lens supports.

In this overview, the beam path is not shown; but it may be noted that such an arrangement is notable for its short object-side, or aerial-image-side, focal length in comparison to the detector-side focal length ("Schnittweite"). Furthermore, the magnifying effect is considerable: The imaging factor (~50) provided by the objective lens O1, and the re-imaging factor (almost 30) provided by the second optical lens group O2, in co-operation amount to about −1400. At the same time, the arrangement is comparatively compact, partly due to the mirrors A1, A2 acting as beam bundle deflecting units. In particular, the longitudinal extension DL of the microprojection optics is shortened by the mirror A1, at the expense of a larger first cross extension DQ1. Through the second mirror A2, this is also limited. Thereby, the area requirement DL*DQ1 is reduced in comparison to an arrangement with only one mirror.

Figure 3:
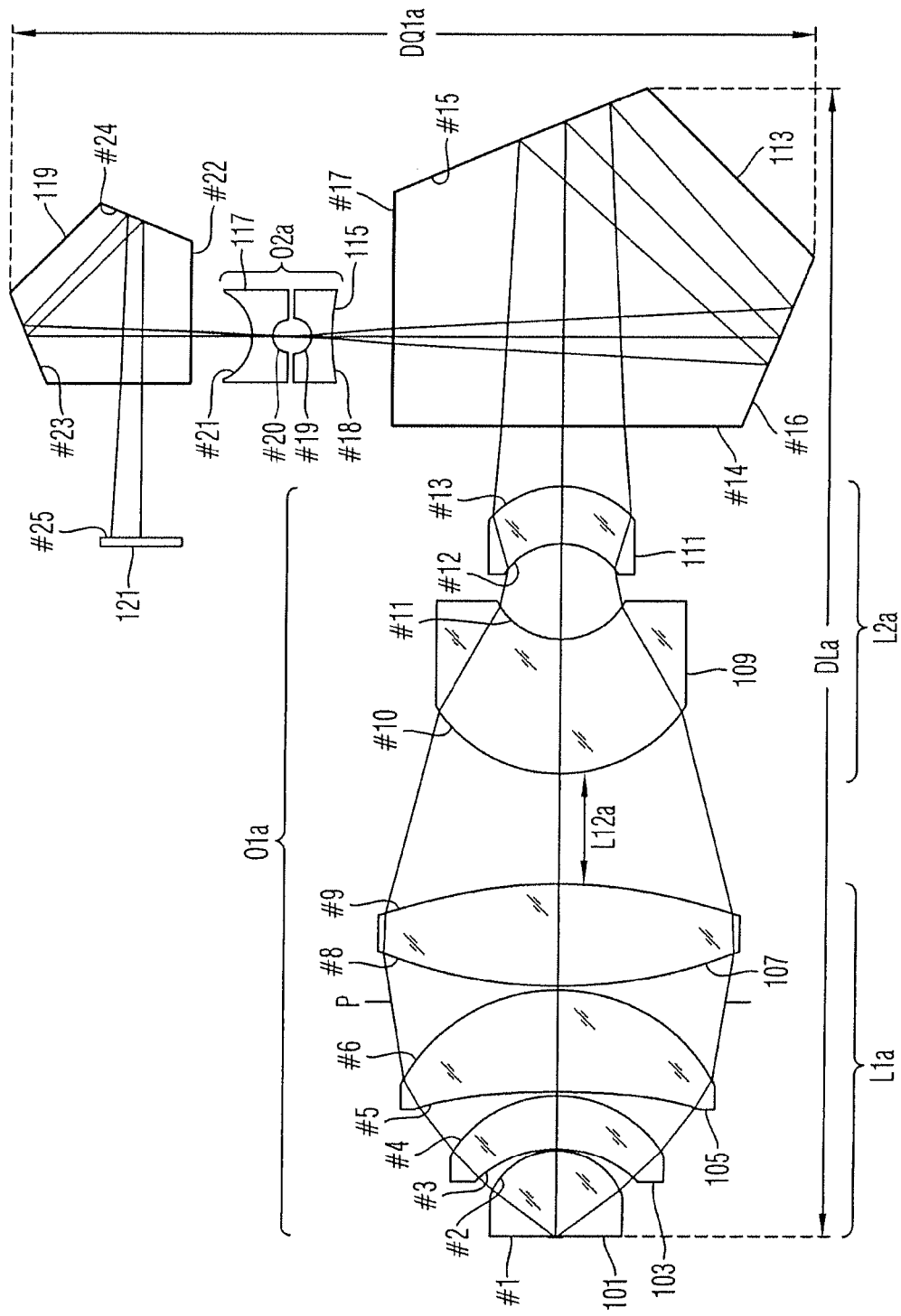
FIG. 3 a microprojection optics with a 180° folding by two pentaprisms as beam bundle deflectors.

In FIG. 3, an exemplary embodiment is shown, in which a double 270°-deflection by pentaprisms is employed: The objective lens O1a in this case has a plano convex front lens 101, followed by a spherical concave-convex meniscus lens 103. It follows a concave-convex meniscus lens 105, the first (concave) surface #5 of which is formed as an aspherical surface (see data in Tables 1a and 1b). Beyond the pupil P, there follows as the last element of the first lens assembly L1a a biconvex lens 107, the second surface #9 of which is formed as an aspherical surface.

TABLE 1a

| face # | radius mm | thickness mm | material | refractive Index | diameter/2 mm |
|---|---|---|---|---|---|
| 0 | — | 0.048 | H2O | 1.436677 | 0.001 |
| 1 | ∞ | 4.210 | SiO2 | 1.560786 | 0.086 |
| 2 | −3.453 | 0.100 | | | 3.109 |
| 3 | −5.672 | 2.607 | SiO2 | 1.560786 | 3.769 |
| 4 | −6.076 | 0.199 | | | 5.075 |
| 5 | −41.196 | 4.997 | SiO2 | 1.560786 | 6.768 |
| 6 | −8.688 | −0.591 | | | 7.571 |
| 7 | — | 0.790 | | | 8.185 |
| 8 | 23.497 | 5.056 | SiO2 | 1.560786 | 8.572 |
| 9 | −22.531 | 5.427 | | | 8.488 |
| 10 | 7.346 | 6.602 | SiO2 | 1.560786 | 5.957 |
| 11 | 3.523 | 4.702 | | | 2.972 |
| 12 | −3.359 | 2.805 | SiO2 | 1.560786 | 2.609 |
| 13 | −4.667 | 3.000 | | | 3.376 |
| 14 | ∞ | 15.000 | SiO2 | 1.560786 | 8.000 |
| 15 | ∞ | 15.000 | Refl. | 1.560786 | 4.000 |
| 16 | ∞ | 19.000 | Refl. | 1.560786 | 4.000 |
| 17 | ∞ | 3.000 | | | 4.000 |
| 18 | −10.273 | 1.000 | SiO2 | 1.560786 | 2.000 |
| 19 | 0.859 | 1.939 | | | 2.000 |
| 20 | −0.788 | 1.000 | SiO2 | 1.560786 | 2.000 |
| 21 | 2.361 | 3.000 | | | 2.000 |
| 22 | ∞ | 8.000 | SiO2 | 1.560786 | 2.000 |
| 23 | ∞ | 8.000 | Refl. | 1.560786 | 2.000 |
| 24 | ∞ | 8.000 | Refl. | 1.560786 | 2.000 |
| 25 | ∞ | 7.588 | Detektor | | 3.020 |

The face #7 herein is a pupil plane within the lens 105 mentioned before, hence its negative distance.

In Table 1a, the faces #5 and #9 are deformed sectors of a sphere, the first six coefficients of which are given according to the formula $$z = \frac{c \cdot h^2}{1 + \sqrt{1 - c^2(k+1)h^2}} + C1 \cdot h^4 + C2 \cdot h^6 + C3 \cdot h^8 + \ldots \,[\text{mm}]$$

$c = 1/r (\text{area curvature}) [\text{mm}^{-1}]$ $h^2 = x^2 + y^2 [\text{mm}^2]$ as:

TABLE 1b

| coefficient | face #5 | face #9 |
|---|---|---|
| K | 0 | 0 |
| C1 [mm$^{-3}$] | −1.021068E−4 | 3.936055E−5 |
| C2 [mm$^{-5}$] | −1.427635E−7 | 2.130907E−8 |
| C3 [mm$^{-7}$] | 1.074060E−11 | 8.597669E−12 |
| C4 [mm$^{-9}$] | −1.123961E−11 | −2.071021E−14 |

TABLE 1b-continued

| coefficient | face #5 | face #9 |
|---|---|---|
| C5 [mm$^{-11}$] | 2.122266E−15 | 1.105772E−14 |
| C6 [mm$^{-13}$] | 5.830975E−24 | 3.575543E−25 |

That is, the first element of the second lens assembly L2a is formed by a convex-concave meniscus lens 109 of larger thickness and diameter than the second element of the second lens assembly L2a, a further convex-concave meniscus lens 111. These two lenses are arranged facing each other with their concave surfaces #11 and #12, respectively.

Following the beam path, next comes a first pentaprism 113, at the inclined inner surfaces #15, #16 of which two reflections occur. It follows the second optical lens group O2a of two biconcave lenses 115 and 117, the more curved surfaces of which #19, #20 are arranged facing each other. Finally, a second, smaller pentaprism 119 with again two reflection faces #23, #24, and the image plane #25 of the detector 121 follow.

The entire arrangement undercuts the exterior dimensions of 6 cm for the longitudinal extension DL and 5 cm for the cross extension DQ1, in which the two aspherical surfaces #5 and #9 take part insofar, as they render space-consuming correction elements dispensible.

Figure 4:
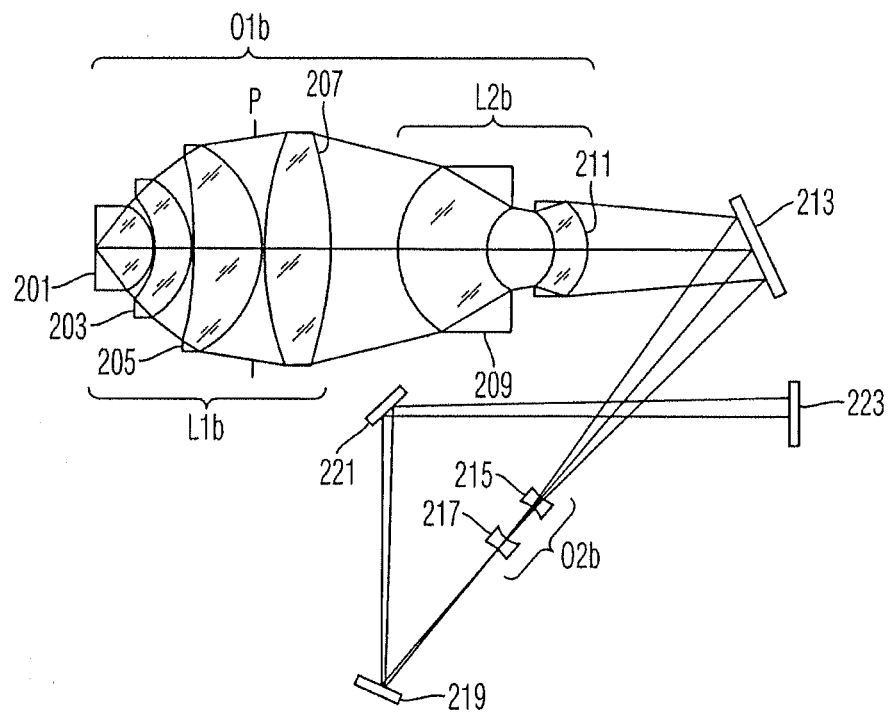
FIG. 4 a microprojection optics with a 360° folding by a 45° mirror staircase (pair) and a 45° mirror.

The second embodiment according to FIG. 4 (data in Tables 2a and 2b), in place of the two pentaprisms, includes a 45°-"mirror staircase" (or mirror pair; Spiegeltreppe) 213, 219 and a mirror 221 arranged at 45° with respect to the optical axis, so that up to the detector 223, a 360°-deflection results: Herein, the second optical lens group O2b (with lenses 215 and 217) is arranged between the two mirrors 213 and 219 of the mirror staircase. Otherwise, the first optical lens group O1b with its lenses 201, 203, 205 and 207 of the first lens assembly L1b and lenses 209 and 211 of the second lens assembly L2b corresponds to those of the first example.

TABLE 2a

| face # | radius mm | thickness mm | material | refractive index | diameter/2 mm |
|---|---|---|---|---|---|
| 0 | — | 0.001 | H2O | 1.436677 | |
| 1 | ∞ | 4.235 | SIO2 | 1.560786 | 0.003 |
| 2 | −3.477 | 0.100 | | | 3.106 |
| 3 | −5.580 | 2.652 | SIO2 | 1.560786 | 3.737 |
| 4 | −6.047 | 0.200 | | | 5.081 |
| 5 | −44.317 | 5.041 | SIO2 | 1.560786 | 6.843 |
| 6 | −8.704 | −0.619 | | | 7.623 |
| 7 | — | 0.820 | | | 8.232 |
| 8 | 23.808 | 5.002 | SIO2 | 1.560786 | 8.615 |
| 9 | −22.865 | 4.932 | | | 8.531 |
| 10 | 7.322 | 6.580 | SIO2 | 1.560786 | 6.103 |
| 11 | 3.532 | 4.868 | | | 3.064 |
| 12 | −3.406 | 2.481 | SIO2 | 1.560786 | 2.751 |
| 13 | −4.542 | 12.219 | | | 3.501 |
| 14 | ∞ | −24.000 | REFL | | 4 |
| 15 | 7.536 | −1.000 | SIO2 | 1.560786 | 1 |
| 16 | −1.871 | −3.019 | | | 1 |
| 17 | 1.714 | −1.000 | SIO2 | 1.560786 | 1 |
| 18 | −3.354 | −13.277 | | | 1 |
| 19 | ∞ | 20 | REFL | | 1 |
| 20 | ∞ | −30 | REFL | | 0.921 |
| 21 | ∞ | 0 | | | 1.539 |

Herein, the negative distance values for the surfaces #14 to #18 and #20 are indicative of the folded beam path in these parts. Similar commonly used indications may be found in the following tables.

In Table 2a, the faces #5 and #9 are deformed sectors of a sphere, the first six coefficients of which are given as:

TABLE 2b

| coeffizient | face #5 | face #9 |
|---|---|---|
| K | 0 | 0 |
| C1 [mm$^{-3}$] | −1.025353E−04 | 3.939285E−05 |
| C2 [mm$^{-5}$] | −1.432218E−07 | 2.027298E−08 |
| C3 [mm$^{-7}$] | 1.061773E−11 | 8.763347E−12 |
| C4 [mm$^{-9}$] | −1.110702E−11 | −2.070957E−12 |
| C5 [mm$^{-11}$] | 2.122266E−15 | 1.105777E−14 |
| C6 [mm$^{-13}$] | 5.830975E−24 | 3.575543E−25 |

Figure 5:
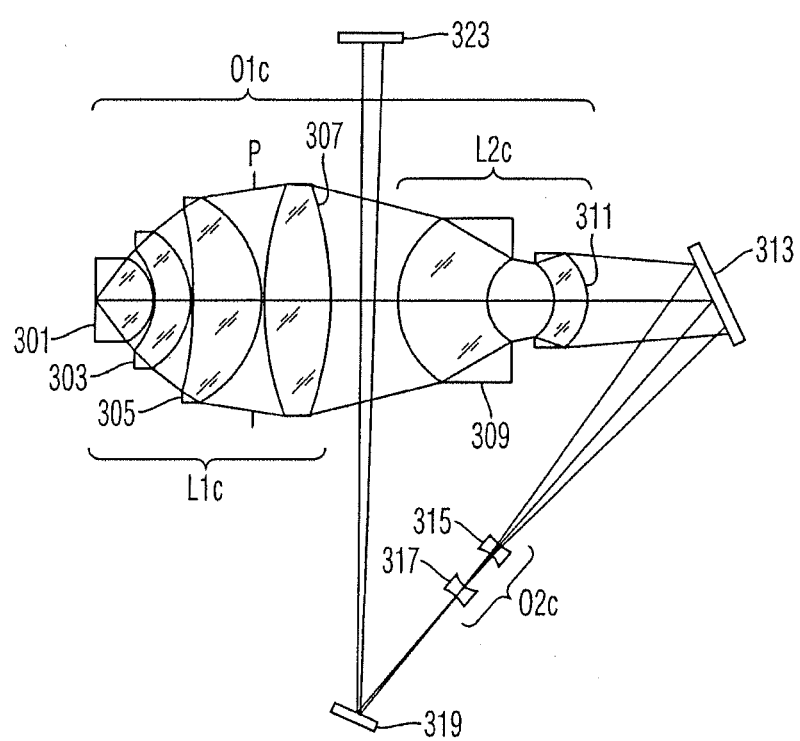
FIG. 5 a microprojection optics with a 270° folding through the objective lens by a 45° mirror staircase.

In the third embodiment according to FIG. 5, the 45°-mirror is omitted, so that a crossing of the beam path in the region of the objective lens O1c between the first L1c and the second lens assembly L2c results. Otherwise, the data correspond to those in Tables 2a and 2b, and the first optical lens group O1c includes a first lens assembly L1c with lenses 301, 303, 305 and 307, and a second lens assembly L2c with lenses 209 and 211. The second optical lens group O2c (with lenses 315 and 317) is arranged between the two mirrors 313 and 319 of the mirror staircase. Thus, the mirrors 313 and 319 of the mirror staircase direct the beam bundle onto the detector 323.

Figure 6:
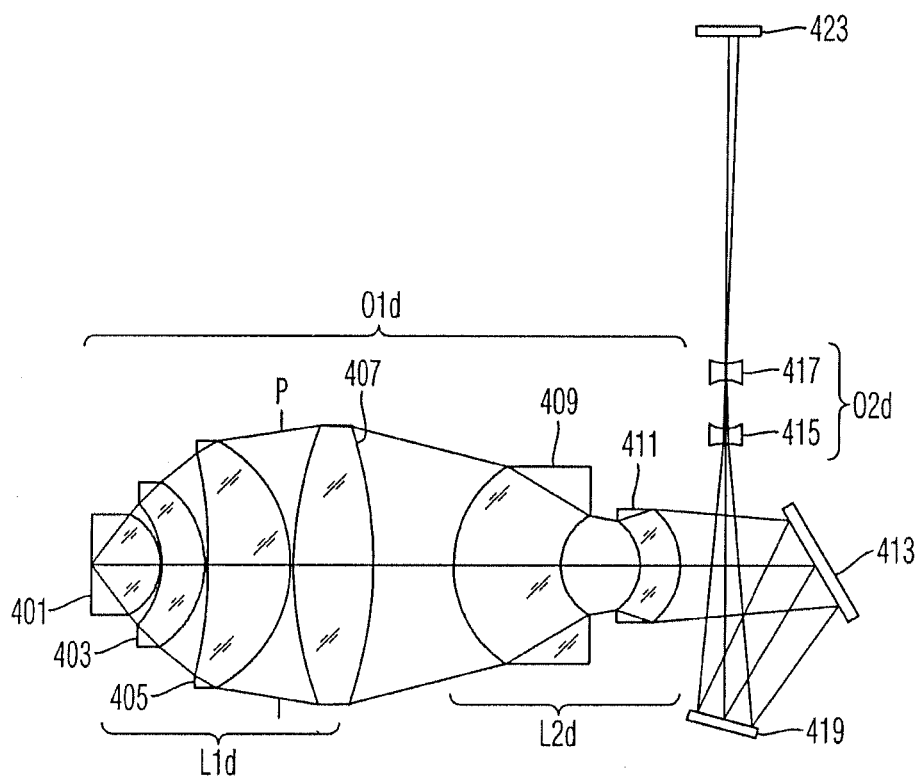
FIG. 6 a microprojection optics with a 270° folding behind the objective lens by a 45° mirror staircase.

In the fourth embodiment according to FIG. 6, in contrast to the embodiment of FIG. 5, the second optical lens group O2d with its lenses 415 and 417 is arranged, in the beam direction, behind the two mirrors 413 and 419 of the mirror staircase, and beyond the crossing of the beam. The first optical lens group O1d has a first lens assembly L1d with lenses 401, 403, 405 and 407, and a second lens assembly L2d with lenses 409 and 411. Thus, the mirrors 413 and 419 of the mirror staircase direct the beam bundle onto the detector 423.

Figure 7:
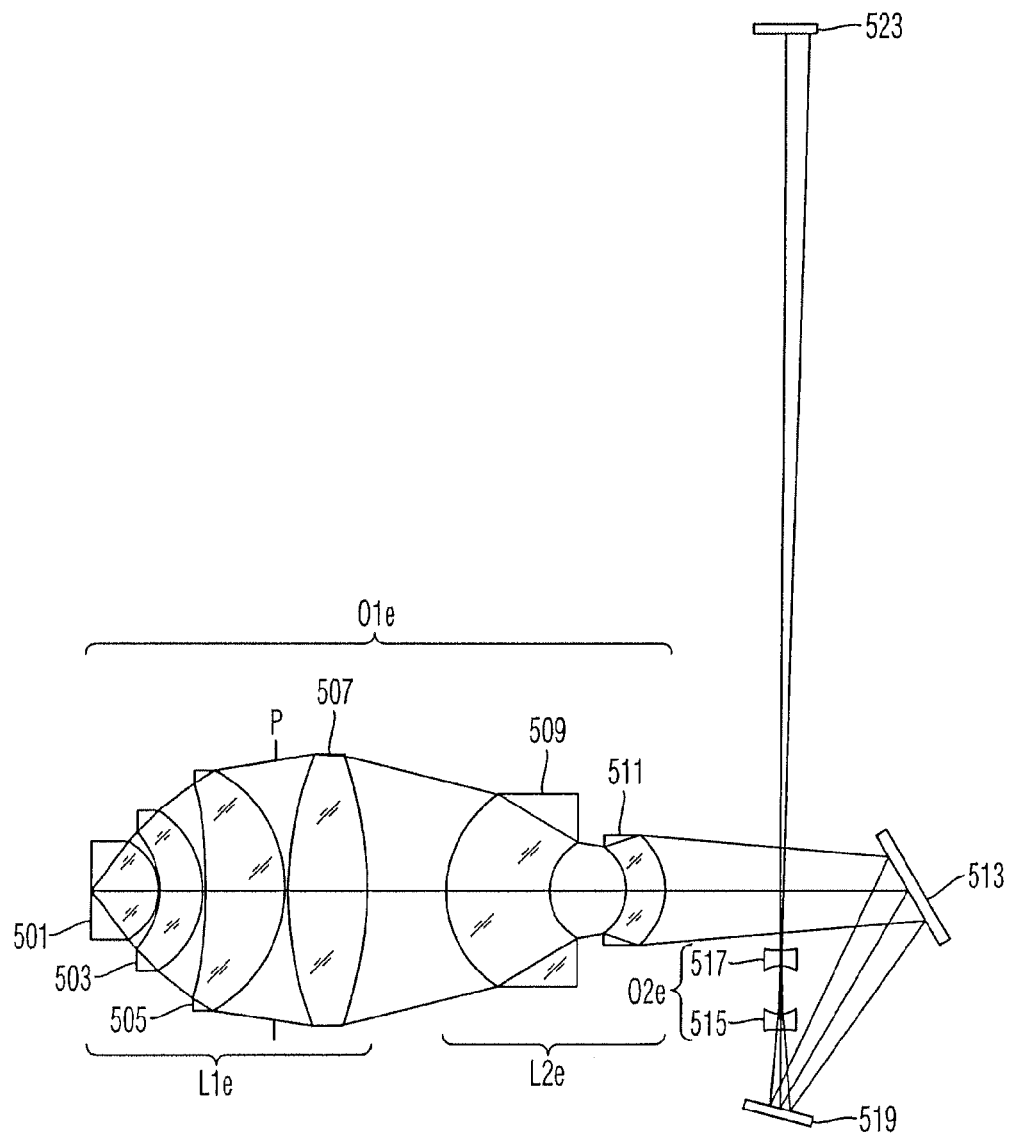
FIG. 7 a further microprojection optics with a 270° folding by a 45° mirror staircase.

On the other hand, in the fifth example (data in Tables 3a and 3b) according to FIG. 7, the second optical lens group O2e with its lenses 515 and 517 is arranged in the beam direction behind the two mirrors 513 and 519 of the mirror staircase, and in front of the beam crossing, i.e. is located between the second mirror 519 of the mirror staircase, and the beam crossing. The first optical lens group O1e has a first lens assembly L1e with lenses 501, 503, 505 and 507, and a second lens assembly L2e with lenses 509 and 511. Thus, the mirrors 513 and 519 of the mirror staircase direct the beam bundle onto the detector 523.

TABLE 3a

| face # | radius mm | thickness mm | material | refractive index | diameter/2 Mm |
|---|---|---|---|---|---|
| 0 | — | 0.001 | H2O | 1.436677 | 0.001 |
| 1 | ∞ | 4.235 | SIO2 | 1.560786 | 0.003 |
| 2 | −3.477 | 0.100 | | | 3.106 |
| 3 | −5.580 | 2.652 | SIO2 | 1.560786 | 3.737 |
| 4 | −6.047 | 0.200 | | | 5.081 |
| 5 | −44.317 | 5.041 | SIO2 | 1.560786 | 6.843 |
| 6 | −8.704 | −0.619 | | | 7.623 |
| 7 | — | 0.820 | | | 8.232 |
| 8 | 23.808 | 5.002 | SIO2 | 1.560786 | 8.615 |
| 9 | −22.865 | 4.932 | | | 8.531 |
| 10 | 7.322 | 6.580 | SIO2 | 1.560786 | 6.103 |
| 11 | 3.532 | 4.868 | | | 3.064 |
| 12 | −3.406 | 2.481 | SIO2 | 1.560786 | 2.751 |
| 13 | −4.542 | 15.219 | | | 3.501 |
| 14 | ∞ | −16.000 | REFL | | 4 |
| 15 | ∞ | 5.000 | REFL | | 1.275 |
| 16 | −7.536 | 1.000 | SIO2 | 1.560786 | 1 |
| 17 | 1.871 | 3.019 | | | 1 |
| 18 | −1.714 | 1.000 | SIO2 | 1.560786 | 1 |
| 19 | 3.354 | 58.277 | | | 1 |
| 20 | ∞ | 0 | | | 1.539 |

In Table 3a, the faces #5 and #9 are deformed sectors of a sphere, the first six coefficients of which are given as:

TABLE 3b

| coefficient | face #5 | face #9 |
|---|---|---|
| C1 [mm$^{-3}$] | −1.025353E−04 | 3.939285E−05 |
| C2 [mm$^{-5}$] | −1.432218E−07 | 2.027298E−08 |
| C3 [mm$^{-7}$] | 1.061773E−11 | 8.763347E−12 |
| C4 [mm$^{-9}$] | −1.110702E−11 | −2.070957E−12 |
| C5 [mm$^{-11}$] | 2.122266E−15 | 1.105777E−14 |
| C6 [mm$^{-13}$] | 5.830975E−24 | 3.575543E−25 |

Figure 8:
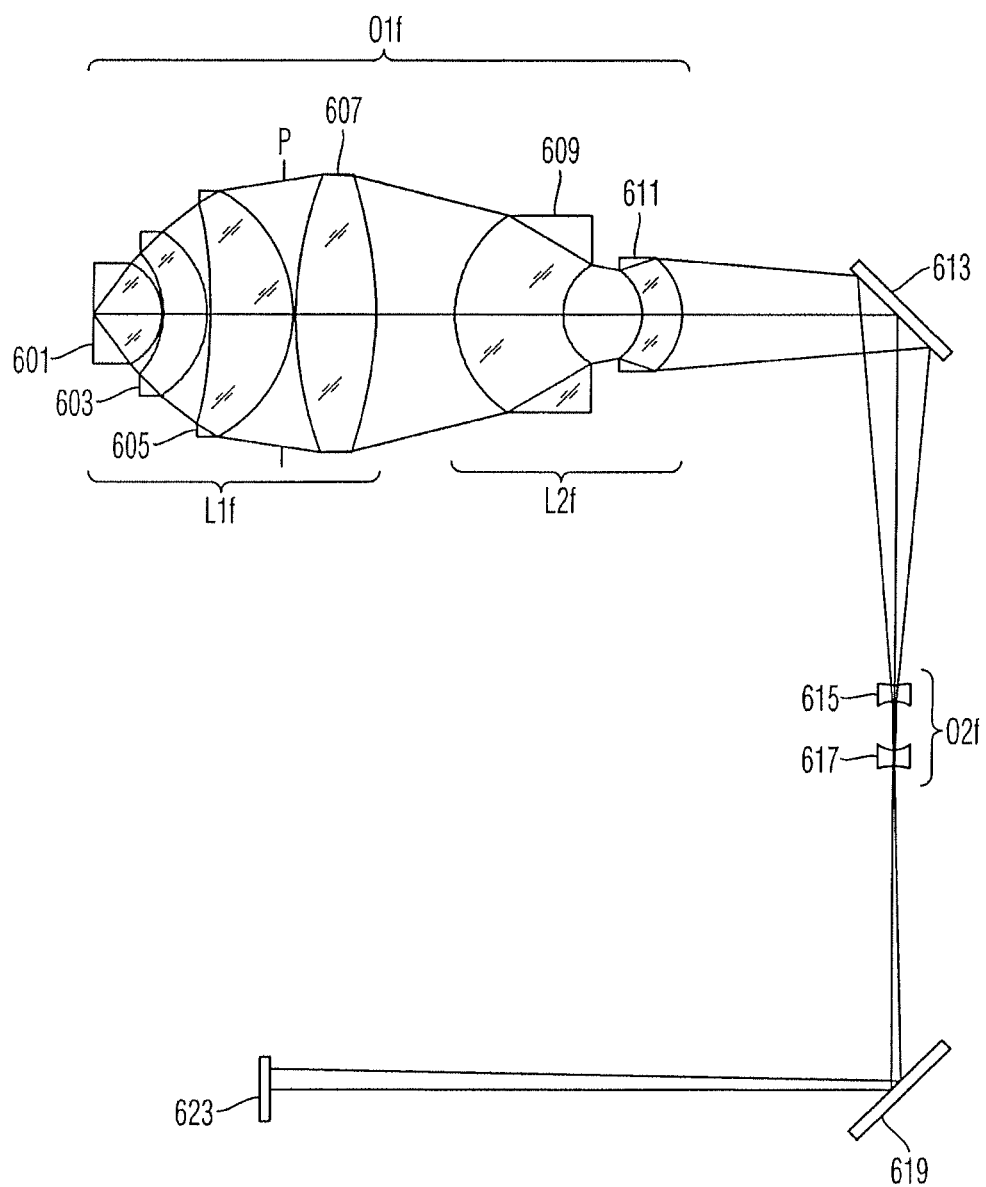
FIG. 8 a microprojection optics with a 180° folding by a 90° mirror staircase.

In the sixth embodiment according to FIG. 8 (see data in Tables 4a and 4b), in place of the 45°-mirror staircase of the preceding examples, with 270° beam deflection, a 90°-mirror staircase with 180° deflection is shown. The second optical lens group O2f with lenses 615 and 617 is arranged between the two mirrors 613 and 619 of the 90°-mirror staircase. The first optical lens group O1f has a first lens assembly L1f with lenses 601, 603, 605 and 607, and a second lens assembly L2f with lenses 609 and 611. Thus, the mirrors 613 and 619 of the mirror staircase direct the beam bundle onto the detector 623.

TABLE 4a

| face # | radius mm | thickness mm | material | refractive index | diameter/2 mm |
|---|---|---|---|---|---|
| 0 | — | 0.001 | H2O | 1.436677 | 0.001 |
| 1 | ∞ | 4.235 | SIO2 | 1.560786 | 0.003 |
| 2 | −3.477 | 0.100 | | | 3.106 |
| 3 | −5.580 | 2.652 | SIO2 | 1.560786 | 3.737 |
| 4 | −6.047 | 0.200 | | | 5.081 |
| 5 | −44.317 | 5.041 | SIO2 | 1.560786 | 6.843 |
| 6 | −8.704 | −0.619 | | | 7.623 |
| 7 | — | 0.820 | | | 8.232 |
| 8 | 23.808 | 5.002 | SIO2 | 1.560786 | 8.615 |
| 9 | −22.865 | 4.932 | | | 8.531 |
| 10 | 7.322 | 6.580 | SIO2 | 1.560786 | 6.103 |
| 11 | 3.532 | 4.868 | | | 3.064 |
| 12 | −3.406 | 2.481 | SIO2 | 1.560786 | 2.751 |
| 13 | −4.542 | 13.219 | | | 3.501 |
| 14 | ∞ | −23.000 | REFL | | 4 |
| 15 | 7.536 | −1.000 | SIO2 | 1.560786 | 0.206 |
| 16 | −1.871 | −3.019 | | | 0.159 |
| 17 | 1.714 | −1.000 | SIO2 | 1.560786 | 0.088 |
| 18 | −3.354 | −20.000 | | | 0.092 |
| 19 | ∞ | 38.277 | REFL | | 4 |
| 20 | ∞ | 0 | | | 1.539 |

In Table 4a, the faces #5 and #9 are deformed sectors of a sphere, the first six coefficients are given as:

TABLE 4b

| coefficient | face #5 | face #9 |
|---|---|---|
| K | 0 | 0 |
| C1 [mm$^{-3}$] | −1.025353E−04 | 3.939285E−05 |
| C2 [mm$^{-5}$] | −1.432218E−07 | 2.027298E−08 |
| C3 [mm$^{-7}$] | 1.061773E−11 | 8.763347E−12 |
| C4 [mm$^{-9}$] | −1.110702E−11 | −2.070957E−12 |
| C5 [mm$^{-11}$] | 2.122266E−15 | 1.105777E−14 |
| C6 [mm$^{-13}$] | 5.830975E−24 | 3.575543E−25 |

Figure 9:
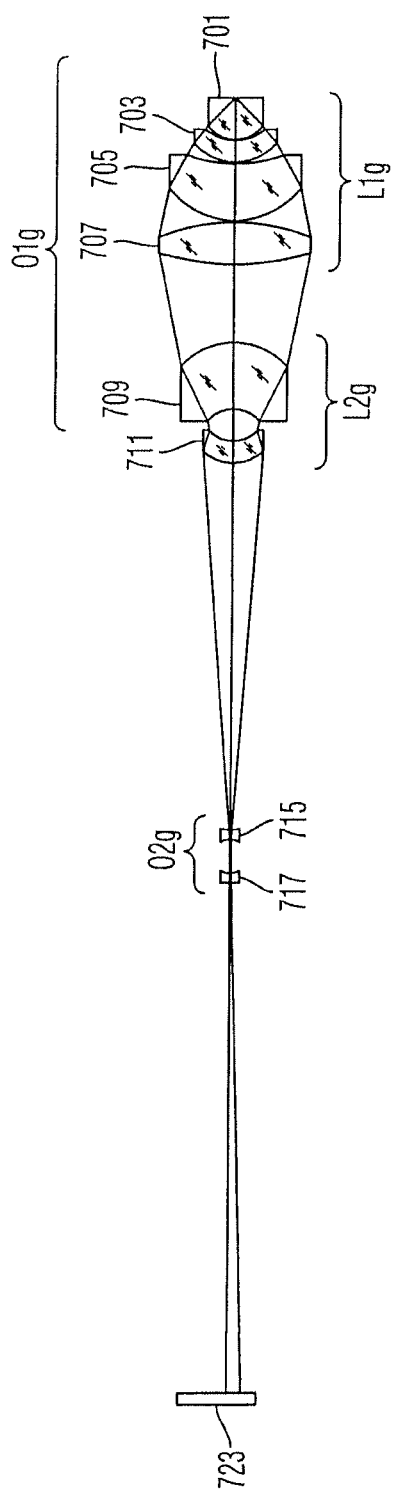
FIG. 9 a microprojection optics with an unfolded beam path.

In the seventh embodiment according to FIG. 9, the beam deflection was entirely dispensed with, so that a longer, but more slender optics with a first optical lens group O1g with lens assembies L1g and L2g, as well as a second optical lens group O2g results, as is advantageous in some applications (see data in Tables 5a and 5b; faces enumerated from the image to the object).

Herein, the last element of the objective lens is made of spinel, and the NA (numerical aperture) is 1.35. The imaging ratio is −1400, the field diameter is 2 μm. The length of the construction (longitudinal dimension DL) is 140 mm. The first lens assembly L1g has lenses 701, 703, 705 and 707, and the second lens assembly L2g has lenses 709 and 711. The second optical lens group O2g has the lenses 715 and 717. By these, the beam bundle is directed directly onto the detector 723.

TABLE 5a

| face # | radius mm | thickness mm | material | refractive index | diameter/2 mm |
|---|---|---|---|---|---|
| 0 | ∞ | 55.007 | | | 1.5 |
| 1 | −9.684 | 1.000 | SIO2 | 1.560786 | 0.122 |
| 2 | 2.409 | 3.677 | | | 0.11 |
| 3 | −1.817 | 1.000 | SIO2 | 1.560786 | 0.139 |
| 4 | 4.201 | 39.553 | | | 0.171 |
| 5 | 4.653 | 2.340 | SIO2 | 1.560786 | 3.18 |
| 6 | 3.458 | 3.443 | | | 2.58 |
| 7 | −3.614 | 7.169 | SIO2 | 1.560786 | 2.766 |
| 8 | −7.449 | 8.447 | | | 5.631 |
| 9 | 25.244 | 4.536 | SIO2 | 1.560786 | 8.056 |
| 10 | −20.907 | 0.553 | | | 8.107 |
| 11 | — | −0.353 | | | 7.663 |
| 12 | 8.736 | 6.122 | SIO2 | 1.560786 | 7.02 |
| 13 | 15.878 | 0.200 | | | 5.145 |
| 14 | 5.835 | 2.312 | SIO2 | 1.560786 | 4.377 |
| 15 | 4.748 | 0.100 | | | 3.173 |
| 16 | 3.610 | 4.452 | Spinel | 1.920333 | 2.914 |
| 17 | — | 0.001 | H2O | 1.436677 | 0.004 |

TABLE 5b

| coefficient | face #9 | face #13 |
|---|---|---|
| K | 0 | 0 |
| C1 [mm$^{-3}$] | −3.279558E−05 | 1.025044E−04 |
| C2 [mm$^{-5}$] | −5.810808E−08 | 1.779706E−07 |
| C3 [mm$^{-7}$] | −8.364057E−12 | −9.988314E−12 |
| C4 [mm$^{-9}$] | 2.187132E−12 | −1.081240E−10 |
| C5 [mm$^{-11}$] | −8.103934E−15 | −1.275510E−15 |
| C6 [mm$^{-13}$] | −1.980573E−27 | −5.487992E−24 |

Figure 10:
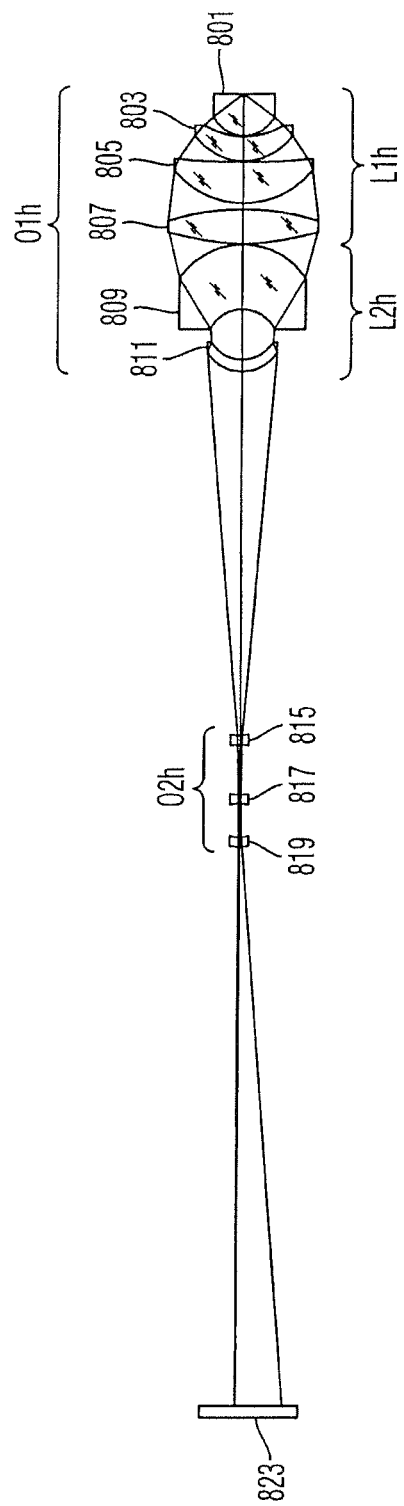
FIG. 10 a further microprojection optics with an unfolded beam path.

On the other hand, in the eighth embodiment according to FIG. 10 (Tables 6a and 6b), a three-lens (lenses 815, 817 and 819) second optical lens group O2h is proposed, in conjunction with a more compact objective lens O1h, in which the distance between the first lens assembly L1h with the lenses 801, 803, 805 and 807, and the second lens assembly L2h with the lenses 809 and 811 was reduced. The numerical aperture NA is 1.25, the imaging ratio is −1400, and the field diameter is 7 μm. The length (longitudinal extension DL) is 140 mm.

TABLE 6a

| face # | radius mm | thickness mm | material | refractive index | diameter/2 mm |
|---|---|---|---|---|---|
| 0 | ∞ | 0.008 | | 1.0003 | 5 |
| 1 | ∞ | 60.322 | | 1.0003 | 4.999 |
| 2 | 38.186 | 1.000 | SIO2 | 1.560786 | 0.406 |
| 3 | 4.035 | 3.578 | | 1.0003 | 0.353 |
| 4 | −6.849 | 1.000 | SIO2 | 1.560786 | 0.236 |
| 5 | 5.715 | 5.435 | | 1.0003 | 0.227 |
| 6 | −4.277 | 1.000 | SIO2 | 1.560786 | 0.274 |
| 7 | 5.498 | 39.231 | | 1.0003 | 0.303 |
| 8 | 4.045 | 1.172 | SIO2 | 1.560786 | 3.421 |
| 9 | 3.515 | 4.923 | | 1.0003 | 3.003 |
| 10 | −3.496 | 6.364 | SIO2 | 1.560786 | 3.138 |

TABLE 6a-continued

| face # | radius mm | thickness mm | material | refractive index | diameter/2 mm |
|---|---|---|---|---|---|
| 11 | −7.311 | 0.124 | | 1.0003 | 6.135 |
| 12 | 22.678 | 3.354 | SIO2 | 1.560786 | 7.255 |
| 13 | −23.833 | 0.451 | | 1.0003 | 7.307 |
| 14 | — | 0.148 | | 1.0003 | 7.13 |
| 15 | 8.586 | 4.045 | SIO2 | 1.560786 | 6.755 |
| 16 | 123.541 | 0.115 | | 1.0003 | 6.258 |
| 17 | 5.809 | 2.379 | SIO2 | 1.560786 | 4.752 |
| 18 | 7.488 | 0.100 | | 1.0003 | 3.875 |
| 19 | 3.340 | 4.046 | SIO2 | 1.560786 | 2.97 |
| 20 | ∞ | 0.001 | H2O | 1.436677 | 0.05 |
| 21 | — | 0.000 | H2O | 1.436677 | 0.004 |

In Table 6a, the faces #12 and #16 are deformed sectors of a sphere, the first six coefficients of which are given as:

TABLE 6b

| coefficient | face #12 | Face #16 |
|---|---|---|
| K | 0 | 0 |
| C1 [mm$^{-3}$] | −3.410143E−05 | 1.026595E−04 |
| C2 [mm$^{-5}$] | −2.164746E−08 | 1.431774E−07 |
| C3 [mm$^{-7}$] | −8.707471E−12 | −1.039708E−11 |
| C4 [mm$^{-9}$] | 2.108696E−12 | 1.405352E−11 |
| C5 [mm$^{-11}$] | −1.131417E−14 | −2.121851E−15 |
| C6 [mm$^{-13}$] | −3.575543E−25 | −5.830975E−24 |

Figure 11:
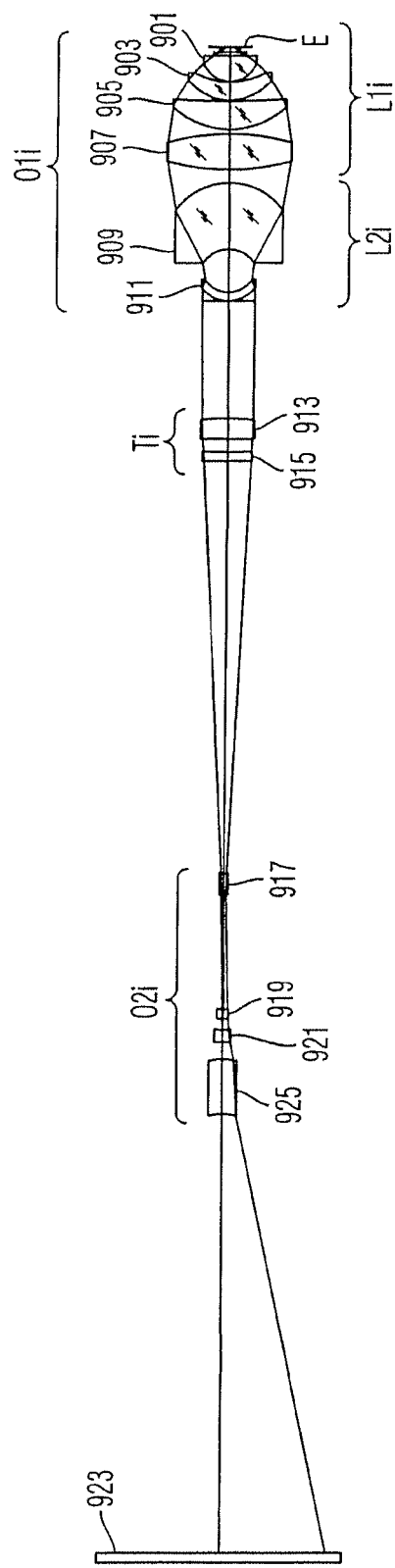
FIG. 11 a microprojection optics with tubus lenses.

The ninth embodiment according to FIG. 11 shows a microprojection optics with a modular arrangement, in which the first L1i and the second lens assembly L2i of the objective lens O1i image substantially to infinity, and only a following two-lens tubus lens group Ti lets the beam bundle converge towards a second optical lens group O2i, which in this example has four lenses. In the latter, the first 917 and the last lens 925 are of lengths considerably exceeding their respective diameters (data in Tables 7a and 7b). The numerical aperture NA is 1.25, and the imaging ratio is −1400. The length of the construction from the plane E of the aerial image to the detector 923 (longitudinal extension DL) is 200 mm, and the field diameter is 20 μm. The first lens assembly L1i includes the positive lenses 901, 903, 905 and 907, and the second lens assembly L2i includes the negative lenses 909 and 911. The tubus lens group Ti includes the lenses 913 and 915, the second optical lens group O2i includes the lenses 917, 919, 921 and 925.

TABLE 7a

| face # | radius mm | thickness mm | material | refractive index | diameter/2 mm |
|---|---|---|---|---|---|
| 0 | ∞ | 0.010 | | 1.0003 | 14 |
| 1 | ∞ | 58.128 | | 1.0003 | 13.998 |
| 2 | −7.903 | 7.229 | SIO2 | 1.560786 | 1.891 |
| 3 | −6.555 | 2.260 | | 1.0003 | 1.605 |
| 4 | −33.340 | 1.611 | SIO2 | 1.560786 | 1.084 |
| 5 | 4.275 | 1.495 | | 1.0003 | 0.874 |
| 6 | −27.222 | 1.243 | SIO2 | 1.560786 | 0.77 |
| 7 | 7.895 | 15.153 | | 1.0003 | 0.721 |
| 8 | −107.280 | 2.811 | SIO2 | 1.560786 | 0.61 |
| 9 | 6.332 | 54.562 | | 1.0003 | 0.602 |
| 10 | 404.070 | 1.179 | SIO2 | 1.560786 | 3.302 |
| 11 | 67.933 | 1.719 | | 1.0003 | 3.337 |
| 12 | 318.577 | 2.755 | SIO2 | 1.560786 | 3.458 |
| 13 | −30.151 | 15.619 | | 1.0003 | 3.565 |
| 16 | 4.575 | 1.111 | SIO2 | 1.560786 | 3.563 |
| 17 | 3.773 | 5.684 | | 1.0003 | 3.141 |
| 18 | −4.099 | 8.880 | SIO2 | 1.560786 | 3.425 |
| 19 | −8.697 | 1.719 | | 1.0003 | 7.114 |

TABLE 7a-continued

| face # | radius mm | thickness mm | material | refractive index | diameter/2 mm |
|---|---|---|---|---|---|
| 20 | 30.625 | 4.738 | SIO2 | 1.560786 | 8.186 |
| 21 | −30.061 | 0.592 |  | 1.0003 | 8.207 |
| 22 | 11.014 | 3.764 | SIO2 | 1.560786 | 7.5 |
| 23 | 366.570 | 0.090 |  | 1.0003 | 7.09 |
| 24 | 7.064 | 2.470 | SIO2 | 1.560786 | 5.546 |
| 25 | 9.775 | 0.062 |  | 1.0003 | 4.74 |
| 26 | 3.773 | 3.382 | SIO2 | 1.560786 | 3.521 |
| 27 | ∞ | 0.500 | H2O | 1.436677 | 2.226 |
| 28 | ∞ | 1.000 | SIO2 | 1.560786 | 1.346 |
| 29 | ∞ | 0.001 | H2O | 1.436677 | 0.012 |
| 30 | — | 0.000 | H2O | 1.436677 | 0.011 |

In Table 7a, the faces #18 and #21 are deformed sectors of a sphere, the first six coefficients of which are given as:

TABLE 7b:

| coefficient | face #18 | face #21 |
|---|---|---|
| K | 0 | 0 |
| C1 [$mm^{-3}$] | −6.333201E−06 | 5.465256E−05 |
| C2 [$mm^{-5}$] | −9.425790E−09 | 5.804199E−08 |
| C3 [$mm^{-7}$] | −2.461655E−12 | −3.034618E−12 |
| C4 [$mm^{-9}$] | 5.630112E−14 | 8.342717E−13 |
| C5 [$mm^{-11}$] | −1.826648E−15 | −3.137300E−16 |
| C6 [$mm^{-13}$] | −3.403842E−26 | −6.012948E−25 |

Figure 12:
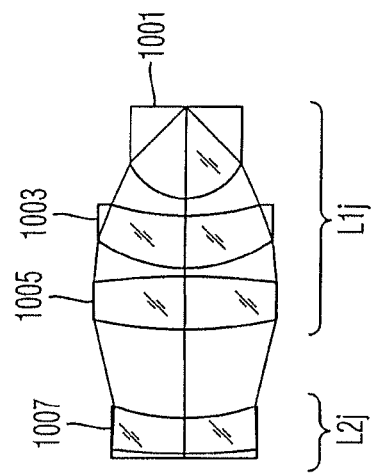
FIG. 12 a microprojection objective lens with spinel lenses.

FIG. 12 shows a particularly compact objective lens having few lenses usable in the arrangement according to FIG. 11, with only three lenses 1001, 1003 and 1005 in the first, positive lens assembly L1j, and only one meniscus lens 1007 in the second, defocussing lens assembly L2j. All the lenses are made of highly refractive spinel ($n_{193}$=1.92), for optimizing the optical properties despite the small number of lenses (data in Table 8). In particular, the numerical aperture NA is 1.35, and the field diameter is 21 µm.

In Table 8, the faces are enumerated from left to right, i.e. towards the object plane.

TABLE 8

| face # | radius mm | thickness mm | material | refractive index | diameter/2 mm |
|---|---|---|---|---|---|
| 3 | — | 0.284 |  | 1.0003 | 4.154 |
| 4 | 40.020 | 2.000 | Spinel | 1.92033299 | 4.152 |
| 5 | 12.306 | 5.062 |  | 1.0003 | 4.025 |
| 6 | 24.587 | 3.000 | Spinel | 1.92033299 | 5.186 |
| 7 | −40.230 | 0.470 |  | 1.0003 | 5.218 |
| 8 | 8.474 | 2.997 | Spinel | 1.92033299 | 4.992 |
| 9 | 14.590 | 0.983 |  | 1.0003 | 4.24 |
| 10 | 3.523 | 5.203 | Spinel | 1.92033299 | 3.183 |
| 11 | ∞ | 0.001 | H2O | 1.43667693 | 0.014 |
| 12 | — | 0 | H2O | 1.43667693 | 0.01 |

Figure 13:
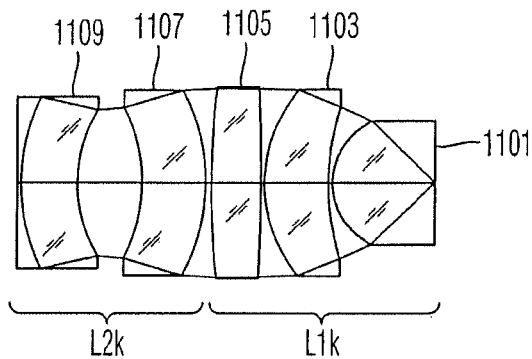
FIG. 13 a microprojection objective lens with spinel lenses.

A similar objective lens, but having a smaller diameter, with altogether five lenses 1101, 1103, 1105, 1107 and 1109 is shown in FIG. 13 (data in Table 9). Also in this case, all the lenses are made of spinel. In this case, the meniscus lens 1107, on account of its slightly defocussing effect, constitutes part of the second lens assembly L2k, even though it is located almost immediately behind the first lens assembly L1k. The numerical aperture NA is 1.35 and the field diameter is 21 µm. The data in the first two lines are intended to indicate the pupil position.

TABLE 9

| face # | radius mm | thickness mm | material | refractive index | diameter/2 mm |
|---|---|---|---|---|---|
| 1 | — | 6.971 |  |  | 4.158 |
| 2 | — | −6.971 |  |  | 4.136 |
| 3 | — | 0.200 |  | 1.0003 | 4.158 |
| 4 | 9.450 | 2.701 | Spinel | 1.92033299 | 4.155 |
| 5 | 6.893 | 3.125 |  | 1.0003 | 3.532 |
| 6 | −7.933 | 2.994 | Spinel | 1.92033299 | 3.649 |
| 7 | −9.691 | 0.289 |  | 1.0003 | 4.457 |
| 8 | 37.965 | 2.384 | Spinel | 1.92033299 | 4.616 |
| 9 | −103.917 | 0.200 |  | 1.0003 | 4.601 |
| 10 | 7.007 | 3.059 | Spinel | 1.92033299 | 4.494 |
| 11 | 12.218 | 0.200 |  | 1.0003 | 3.697 |
| 12 | 3.343 | 4.848 | Spinel | 1.92033299 | 2.991 |
| 13 | ∞ | 0.001 | H2O | 1.43667693 | 0.012 |
| 14 | 0.000 | 0.000 | H2O | 1.43667693 | 0.01 |

Figure 14:
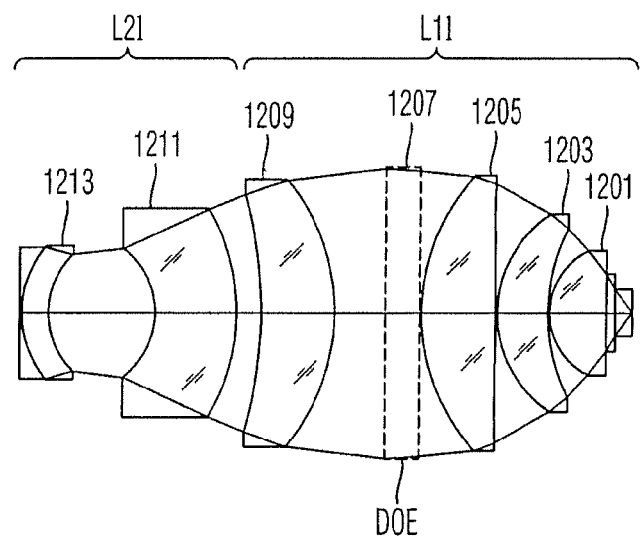
FIG. 14 a microprojection objective lens with a DOE and an aspherical face.

Another solution to miniaturising is shown in FIG. 14: Here, a five-element positive lens assembly L11 (elements 1201, 1203, 1205, 1207 and 1209) is followed by a two-lens second assembly L21 (elements 1211 and 1213) having a defocussing effect. The fourth element 1207 in the beam direction is a diffractive optical element (DOE) having a positive refractive power on the second face #10 of the element. Furthermore, the front face #13 of the third element 1205 in the beam direction, a convex lens, is formed as an aspherical face. Also in this case, an efficient reduction of aberrations is achieved despite the small number of lenses (data in Tables 10a, 10b, 10c). The numerical aperture NA is 1.25, the field diameter is 8 µm and the maximum incident angle at the optical surfaces is 52°. The first lines Table 10a indicate the position of the pupil.

TABLE 10a

| face # | radius mm | thickness mm | material | refractive index | diameter/2 mm |
|---|---|---|---|---|---|
| 1 | — | 12.151 |  |  | 3.842 |
| 2 | — | −12.151 |  |  | 3.805 |
| 3 | — | 0.100 |  | 1.0003 | 3.842 |
| 4 | 6.129 | 1.516 | SIO2 | 1.560786 | 3.838 |
| 5 | 4.774 | 6.092 |  | 1.0003 | 3.405 |
| 6 | −4.682 | 4.735 | SIO2 | 1.560786 | 3.722 |
| 7 | −11.605 | 1.392 |  | 1.0003 | 6.013 |
| 8 | −25.302 | 4.220 | SIO2 | 1.560786 | 6.855 |
| 9 | −11.989 | 2.911 |  | 1.0003 | 7.695 |
| 10 | ∞ | 2.000 | SIO2 | 1.560786 | 8.387 |
| 11 | ∞ | 0.100 |  | 1.0003 | 8.252 |
| 12 | 11.888 | 4.190 | SIO2 | 1.560786 | 7.922 |
| 13 | −203.230 | 0.100 |  | 1.0003 | 7.5 |
| 14 | 6.862 | 2.877 | SIO2 | 1.560786 | 5.696 |
| 15 | 10.777 | 0.100 |  | 1.0003 | 4.864 |
| 16 | 3.968 | 3.252 | SIO2 | 1.560786 | 3.578 |
| 17 | ∞ | 0.499 | H2O | 1.436677 | 2.23 |
| 18 | ∞ | 1.000 | SIO2 | 1.560786 | 1.34 |
| 19 | ∞ | 0.000 | H2O | 1.436677 | 0.012 |
| 20 | — | 0.000 | H2O | 1.436677 | 0.012 |

In Table 10a, the face #13 is a deformed sector of a sphere, the first six coefficients of which are given as:

TABLE 10b

| coefficient | face #13 |
|---|---|
| K | 0 |
| C1 [$mm^{-3}$] | 4.0987E−05 |
| C2 [$mm^{-5}$] | 4.4674E−08 |
| C3 [$mm^{-7}$] | 9.4653E−10 |
| C4 [$mm^{-9}$] | −1.1660E−12 |

TABLE 10b-continued

| coefficient | face #13 |
|---|---|
| C5 [mm$^{-11}$] | 3.8417E−17 |
| C6 [mm$^{-13}$] | −6.1670E−25 |

In Table 10a, the face #10 is a diffractive planar face, the effects of which are given as:

TABLE 10c

| coefficient | face #10 |
|---|---|
| C0 [μm] | 4.95E+03 |
| C1 [μm/mm$^2$] | −1.3214E−02 |
| C2 [μm/mm$^4$] | −1.6851E−06 |
| C3 [μm/mm$^6$] | 2.4398E−08 |
| C4 [μm/mm$^8$] | −2.5752E−10 |
| λ0 [μm] | 0.193368 |
| K | 1 | wherein $$\Phi(h) = k\frac{2\pi}{\lambda_0}(C0 + C1 \cdot h^2 + C2 \cdot h^4 + C3 \cdot h^6 + \ldots)$$

(h)=rotationally symmetric phase distribution k=order of diffraction

=design wavelength

Figure 15:
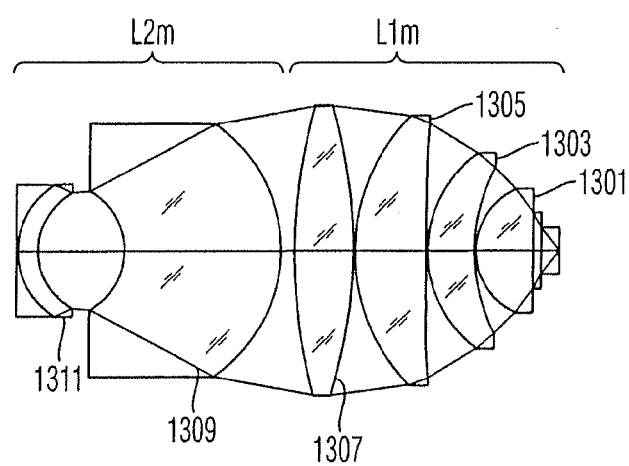
FIG. 15 a microprojection objective lens with two aspherical faces.

In a similar manner, in the objective lens according to FIG. 15 with the lens assemblies L1m (lenses 1301, 1303, 1305 and 1307) and L2m (lenses 1309 and 1311) two aspherical faces #8 and #11, on the front face of the third lens 1305 and on the back face of the fourth lens 1307, function as aberration reducing members (data in Tables 11a and 11b). This objective lens is closely related to the one shown in FIG. 11. The numerical aperture NA is 1.25, the field diameter is 21 μm and the optically free lens diameter is 17 mm. The maximum angle of incidence at the optical surfaces is 65°.

TABLE 11a

| face # | radius mm | thickness mm | material | refractive index | diameter/2 mm |
|---|---|---|---|---|---|
| 1 | — | 10.021 | | | 3.835 |
| 2 | — | −10.021 | | | 3.804 |
| 3 | — | 0.100 | | 1.0003 | 3.835 |
| 4 | 4.526 | 1.145 | SIO2 | 1.560786 | 3.828 |
| 5 | 3.857 | 4.958 | | 1.0003 | 3.362 |
| 6 | −3.973 | 9.000 | SIO2 | 1.560786 | 3.445 |
| 7 | −8.944 | 0.799 | | 1.0003 | 7.315 |
| 8 | 29.739 | 3.349 | SIO2 | 1.560786 | 8.381 |
| 9 | −29.384 | 0.100 | | 1.0003 | 8.405 |
| 10 | 11.050 | 4.040 | SIO2 | 1.560786 | 7.799 |
| 11 | 927.840 | 0.100 | | 1.0003 | 7.395 |
| 12 | 7.002 | 2.664 | SIO2 | 1.560786 | 5.653 |
| 13 | 10.208 | 0.100 | | 1.0003 | 4.812 |
| 14 | 3.955 | 3.266 | SIO2 | 1.560786 | 3.575 |
| 15 | ∞ | 0.499 | H2O | 1.436677 | 2.224 |
| 16 | ∞ | 1.000 | SIO2 | 1.560786 | 1.339 |
| 17 | ∞ | 0.000 | H2O | 1.436677 | 0.012 |
| 18 | 0.000 | 0.000 | H2O | 1.436677 | 0.011 |

In Table 11a, the faces #8 and #11 are deformed sectors of a sphere, the first six coefficients of which are given as:

TABLE 11b

| coefficient | face #8 | face #11 |
|---|---|---|
| K | 0 | 0 |
| C1 [mm$^{-3}$] | −1.613821E−05 | 4.746143E−05 |
| C2 [mm$^{-5}$] | −1.209692E−08 | 5.786051E−08 |
| C3 [mm$^{-7}$] | −1.354280E−12 | −9.581653E−13 |
| C4 [mm$^{-9}$] | 5.328516E−14 | 7.907506E−13 |
| C5 [mm$^{-11}$] | −2.139756E−15 | −3.137299E−16 |
| C6 [mm$^{-13}$] | 0.000000E+00 | −5.874428E−25 |

In each of the objective lenses of FIGS. 11, 14 and 15, between the respective front lens and the aerial image, a planoparallel quartz plate is arranged, which is spaced apart from the front lens by a thin water film. The quartz plate may be located directly at the position of the aerial image, or in a certain distance therefrom. The water film decouples the front lens on the object side from possible mechanical influences, so that its precise adjustment may be maintained in operation. Even a minor misadjustment would be detrimental in some applications because of the large angles of incidence to this element.

The optics explained in detail in Tables 1 to 11b are calculated to provide optimal reduction of aberration for the laser light source wavelength of 193 nm. The proposed principle is, however, also applicable to other wavelengths, e.g. 266 nm, 248 nm or 157 nm, i.e. to UV- and particularly to DUV-optics. In these wavelength ranges, synthetic quartz is still sufficiently transmissive. Also the optics calculated in detail are (except the spinel lenses according to FIGS. 9, 12 and 13) quartz optics.

Figure 16:
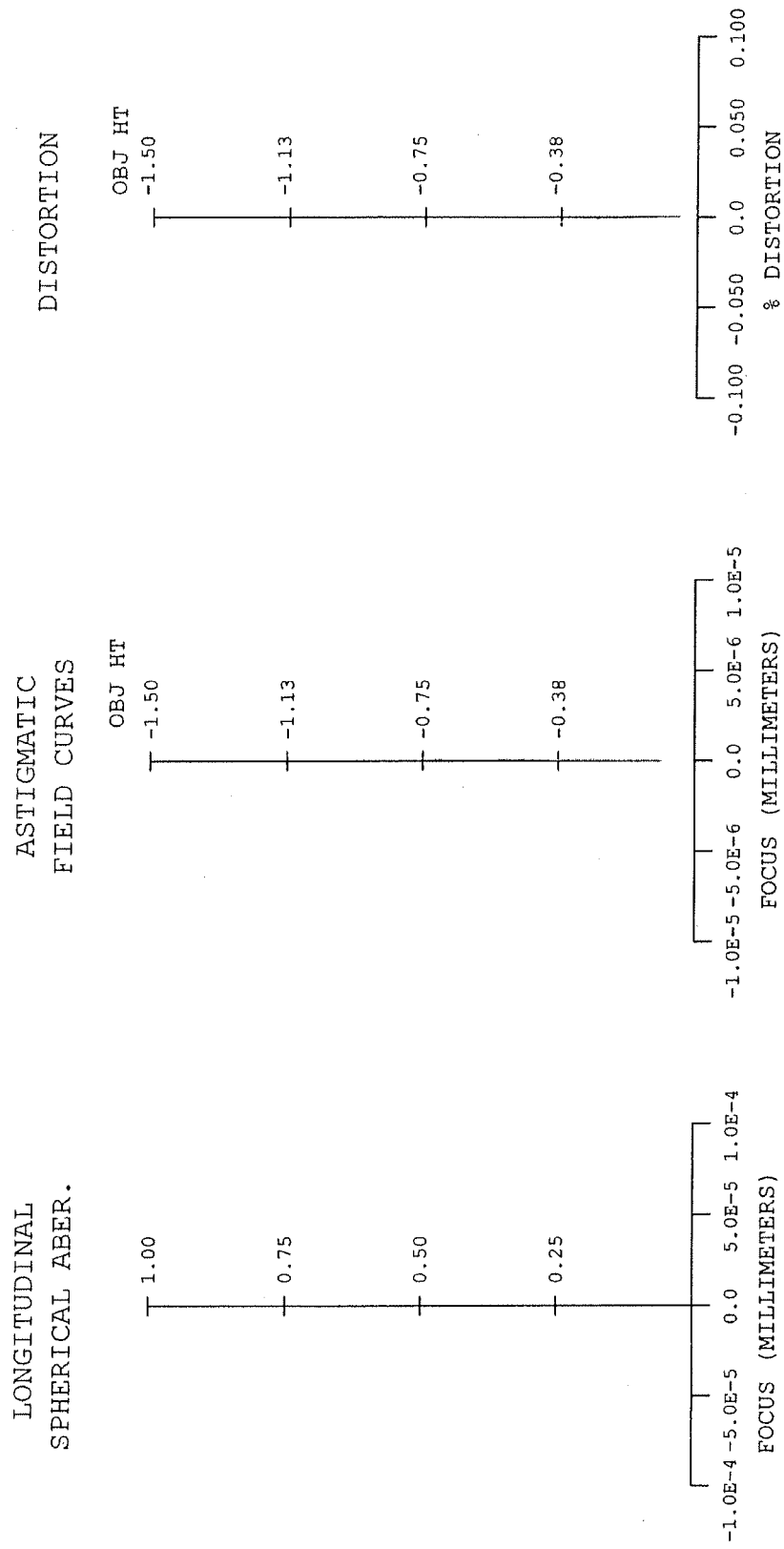
FIG. 16 a typical aberration distribution for a microprojection optics.

An aberration distribution typical for a microprojection optics according to the disclosure is shown in FIG. 16. The underlying optics is the one shown in FIG. 9, and presented in detail in Tables 5a and 5b. It is apparent that the remaining spherical aberration is everywhere smaller than 0.1 μm. The rms (root mean square) value is particularly smaller than 0.01*λ, wherein the wavelength λ is, e.g., 193 nm. The disclosure provides an imaging microoptics which is compact and robust, e.g. by including at least one aspherical element and/or has a folded beam path, and especially provides a magnification of, by magnitude, |β'|>800.

The images provided by the inventive microprojection optics are evaluated by a controller with respect to the positions at which the projected mask marks occur, by using an image processing method. From this information, the effective relative position of the wafer stage WST with respect to the projected aerial image of the mask R is evaluated. These data may be used for fine-positioning the wafer W with respect to the aerial image of the mask R, as is actually provided by the projection optics PL. Also, in variants it is possible, e.g. to control the positioning of the projection optics PL with a metro stage, or to arrange the microprojection optics at same.

In an exemplary process, the wafer is first illuminated using a first mask, and the exact position of the aerial image is detected with reference to the wafer stage WST. Then, the first mask is exchanged by a second mask, to perform a second illumination of the wafer. Prior to the second illumination, the wafer is positioned so accurately, using a further aerial image measurement, that the position of the second aerial image actually coincides with that of the first aerial image, and the advantages of the double patterning process may become fully effective.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the disclosure as defined in the following claims.

What is claimed is:

1. An imaging aerial image sensor, comprising:
a first optical element group comprising a first optical element configured to transfer an object side beam bundle emanating from an object or an aerial image positioned in an object plane into an image side beam bundle;
a second optical element group configured to focus the image side beam bundle to image the object or aerial image onto an image plane with a total magnification β' of |β'|>800;
wherein:
the imaging aerial image sensor has a maximum longitudinal extension in a direction perpendicular to the object plane;
the imaging aerial image sensor has a first maximum lateral extension in a direction perpendicular to the maximum longitudinal extension;
the imaging aerial image sensor has a second maximum lateral extension perpendicular to both the maximum longitudinal extension and the first maximum lateral extension;
the first maximum lateral extension is greater than or equal to the second maximum lateral extension;
a sum of the maximum longitudinal extension and the first maximum lateral extension is less than 250 mm; and
the imaging aerial image sensor is configured to be integrated in a wafer stage.

2. The imaging aerial image sensor of claim 1, wherein at least one of the elements of the first optical element group comprises a high index material lens.

3. The imaging aerial image sensor of claim 1, comprising one or more prisms arranged to deflect the image side beam bundle in a folding plane.

4. The imaging aerial image sensor of claim 2, comprising one or more prisms arranged to deflect the image side beam bundle in a folding plane.

5. The imaging aerial image sensor of claim 3, wherein at least one of the one or more prisms is a pentaprism.

6. The imaging aerial image sensor of claim 4, wherein at least one of the one or more prisms is a pentaprism.

7. The imaging aerial image sensor of claim 1, comprising one or more aberration correction elements.

8. The imaging aerial image sensor of claim 2, comprising one or more aberration correction elements.

9. The imaging aerial image sensor of claim 3, comprising one or more aberration correction elements.

10. The imaging aerial image sensor of claim 4, comprising one or more aberration correction elements.

11. The imaging aerial image sensor of claim 5, comprising one or more aberration correction elements.

12. The imaging aerial image sensor of claim 6, comprising one or more aberration correction elements.

13. The imaging aerial image sensor of claim 1, wherein the first optical element is a front lens.

14. The imaging aerial image sensor of claim 1, wherein the second optical element group comprises at least one lens.

15. The imaging aerial image sensor of claim 13, wherein the second optical element group comprises at least one lens.

16. An imaging aerial image sensor, comprising:
a first optical element group comprising a first optical element configured to transfer an object side beam bundle emanating from an object or an aerial image positioned in an object plane into an image side beam bundle;
a second optical element group configured to focus the image side beam bundle to image the object or aerial image onto an image plane with a total magnification β' of |β'|>800;
wherein:
the imaging aerial image sensor has a maximum longitudinal extension in a direction perpendicular to the object plane;
the imaging aerial image sensor has a first maximum lateral extension in a direction perpendicular to the maximum longitudinal extension;
the imaging aerial image sensor has a second maximum lateral extension perpendicular to both the maximum longitudinal extension and the first maximum lateral extension;
the first maximum lateral extension is greater than or equal to the second maximum lateral extension;
a sum of the maximum longitudinal extension and the first maximum lateral extension is less than 250 mm;
at least one of the elements of the first optical element group comprises a high index material lens;
the imaging aerial sensor comprises comprising one or more prisms arranged to deflect the image side beam bundle in a folding plane;
the imaging aerial sensor comprises one or more aberration correction elements;
at least one of the one or more prisms is a pentaprism;
the first optical element is a front lens; and
the imaging aerial image sensor is configured to be integrated in a wafer stage.

17. The imaging aerial image sensor of claim 16, wherein the second optical element group comprises at least one lens.

18. An imaging aerial image sensor, comprising:
a first optical element group comprising a first optical element configured to transfer an object side beam bundle emanating from an object or an aerial image positioned in an object plane into an image side beam bundle;
a second optical element group configured to focus the image side beam bundle to image the object or aerial image onto an image plane with a total magnification β' of |β'|>800;
wherein:
the imaging aerial image sensor has a maximum longitudinal extension in a direction perpendicular to the object plane;
the imaging aerial image sensor has a first maximum lateral extension in a direction perpendicular to the maximum longitudinal extension;
the imaging aerial image sensor has a second maximum lateral extension perpendicular to both the maximum longitudinal extension and the first maximum lateral extension;
the first maximum lateral extension is greater than or equal to the second maximum lateral extension;
a sum of the maximum longitudinal extension and the first maximum lateral extension is less than 250 mm;
the second optical element group comprises at least one lens; and
the imaging aerial image sensor is configured to be integrated in a wafer stage.

19. A stage, comprising:

an imaging aerial image sensor which comprises:

a first optical element group comprising a first optical element configured to transfer an object side beam bundle emanating from an object or an aerial image positioned in an object plane into an image side beam bundle; and a second optical element group configured to focus the image side beam bundle to image the object or aerial image onto an image plane with a total magnification $\beta'$ of $|\beta'|>800$;

wherein:

the imaging aerial image sensor has a maximum longitudinal extension in a direction perpendicular to the object plane;

the imaging aerial image sensor has a first maximum lateral extension in a direction perpendicular to the maximum longitudinal extension;

the imaging aerial image sensor has a second maximum lateral extension perpendicular to both the maximum longitudinal extension and the first maximum lateral extension;

the first maximum lateral extension is greater than or equal to the second maximum lateral extension;

a sum of the maximum longitudinal extension and the first maximum lateral extension is less than 250 mm; and the stage is a wafer stage.

20. The stage of claim 19, wherein at least one of the elements of the first optical element group comprises a high index material lens.

21. The stage of claim 19, wherein the imaging aerial image sensor comprises one or more prisms arranged to deflect the image side beam bundle in a folding plane.

* * * * *

UNITED STATES PATENT AND TRADEMARK OFFICE
CERTIFICATE OF CORRECTION

PATENT NO. : 8,451,458 B2
APPLICATION NO. : 13/423760
DATED : May 28, 2013
INVENTOR(S) : Hans-Juergen Rostalski It is certified that error appears in the above-identified patent and that said Letters Patent is hereby corrected as shown below:

In the Specification

Column 3, Line 4, delete "ressistivity" insert --resistivity--;

Column 7, Line 2, delete "coeffizient" insert --coefficient--;

Column 8, Line 64, delete "assembies" insert --assemblies--.

Signed and Sealed this
Fifteenth Day of October, 2013

Teresa Stanek Rea
*Deputy Director of the United States Patent and Trademark Office*